United States Patent
Moon

(10) Patent No.: US 9,179,577 B2
(45) Date of Patent: Nov. 3, 2015

(54) FLAT HEAT PIPE AND FABRICATION METHOD THEREOF

(75) Inventor: Seok Hwan Moon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 378 days.

(21) Appl. No.: 13/572,176

(22) Filed: Aug. 10, 2012

(65) Prior Publication Data

US 2013/0112372 A1    May 9, 2013

(30) Foreign Application Priority Data

Nov. 8, 2011  (KR) .................. 10-2011-0116034

(51) Int. Cl.
F28D 15/04  (2006.01)
H05K 7/20  (2006.01)
F28F 1/20  (2006.01)
H01L 23/427  (2006.01)

(52) U.S. Cl.
CPC .......... H05K 7/20336 (2013.01); F28D 15/046 (2013.01); F28F 1/20 (2013.01); H01L 23/427 (2013.01); H01L 2924/0002 (2013.01); Y10T 29/49353 (2015.01)

(58) Field of Classification Search
CPC ..................................... F28D 15/046
USPC ........................ 165/104.21, 104.26
See application file for complete search history.

(56) References Cited

U.S. PATENT DOCUMENTS

| | | | |
|---|---|---|---|
| 5,179,043 A | 1/1993 | Weichold et al. | |
| 5,219,021 A | 6/1993 | Edelstein et al. | |
| 5,465,782 A * | 11/1995 | Sun et al. | 165/104.26 |
| 5,704,415 A * | 1/1998 | Suzuki et al. | 165/104.26 |
| 6,216,343 B1 | 4/2001 | Leland et al. | |
| 6,422,307 B1 * | 7/2002 | Bhatti et al. | 165/185 |
| 6,745,825 B1 * | 6/2004 | Nakamura et al. | 165/104.26 |
| 2001/0047859 A1 * | 12/2001 | Ishida et al. | 165/104.14 |
| 2007/0151709 A1 * | 7/2007 | Touzov | 165/104.26 |
| 2008/0185128 A1 * | 8/2008 | Moon et al. | 165/104.26 |
| 2011/0174465 A1 | 7/2011 | Liu et al. | |
| 2011/0203777 A1 * | 8/2011 | Zhao et al. | 165/104.26 |
| 2011/0303392 A1 * | 12/2011 | Horiuchi et al. | 165/104.26 |

FOREIGN PATENT DOCUMENTS

KR    10-0631050 B1    9/2006
WO    WO 2010098303 A1 *    9/2010

OTHER PUBLICATIONS

Gary Shives et al., "Comparative Thermal Performance Evaluation of Graphite/Epoxy Fin Heat Sinks", IEEE, Jun. 1-4, 2004, pp. 410-417, vol. 1.
S. Tzanova et al., "Analytical Investigation of Flat Silicon Micro Heat Spreaders", IEEE, Oct. 3-7, 2004, pp. 2296-2302, vol. 4.
Shung-Wen Kang et al., "Metallic micro heat pipe heat spreader fabrication", Applied Thermal Engineering, Feb. 2004, pp. 299-309, vol. 24, Issues 2-3.

* cited by examiner

Primary Examiner — Allen Flanigan
(74) Attorney, Agent, or Firm — Rabin & Berdo, P.C.

(57) ABSTRACT

Disclosed are a flat heat pipe which has a structure integrated with a heat sink, and a facilitated fabrication method thereof. The flat heat pipe includes: a flat body portion including a plurality of heat sink fins formed on an outer surface thereof, and a plurality of through-holes formed therein and being separated by at least one separation film; and at least one groove formed in at least one surface from among a top surface and a bottom surface of one side portion of each of the plurality of through-holes.

9 Claims, 2 Drawing Sheets

FLAT HEAT PIPE AND FABRICATION METHOD THEREOF

CROSS-REFERENCE TO RELATED APPLICATIONS

This application is based on and claims priority from Korean Patent Application No. 10-2011-0116034, filed on Nov. 8, 2011, with the Korean Intellectual Property Office, the disclosure of which is incorporated herein in its entirety by reference.

TECHNICAL FIELD

The present disclosure relates to a flat heat pipe fabricated by extrusion, and a fabrication method thereof.

BACKGROUND

In general, chips or modules that are packaged in electronic systems are gradually being made more highly integrated and miniaturized due to advances in semiconductor fabrication technology. Because the thermal density of components included in electronic systems is greatly increasing due to such trends, cooling techniques are required to effectively dissipate heat. In particular, improving the contact interfaces between components which induce most of the thermal resistance in heat dissipating paths is an important issue for research.

Related art cooling devices that can be applied to miniature portable and stationary electronic systems include heat sinks, fans, and miniature heat pipes having a circular cross sectional diameter of 3 mm or greater.

Because heat sinks may be fabricated freely in terms of size and width, heat sinks have been widely used as a basic cooling means. However, when a very small size is required, the heat dissipation rate becomes relatively less due to the reduction in the heat dissipating area.

With a fan, there is a limit to how much the size thereof can be reduced, and there is the problem in which the reliability thereof is relatively reduced.

A miniature heat pipe with a circular cross sectional diameter of 3 mm or greater may be suitably compressed and used on a thin film structure. However, because a miniature heat pipe with such a circular cross sectional diameter is designed with an initially circular cross section, when the heat pipe is compressed to fit electronic equipment with a miniature and thin film structure, heat dissipating performance is greatly reduced by a change in wick structure.

SUMMARY

The present disclosure has been made in an effort to provide a flat heat pipe fabricated by extrusion, and a fabrication method thereof, which are capable of securing room for vapor flow and facilitating the flow of working fluid in a flat heat pipe structure to improve heat dissipation performance, which has an integrated heat sink structure, and which also facilitates the fabrication processes thereof.

An exemplary embodiment of the present disclosure provides a flat heat pipe including: a flat body portion including a plurality of heat sink fins formed on an outer surface thereof, and a plurality of through-holes formed therein and being separated by at least one separation film; and at least one groove formed in at least one surface from among a top surface and a bottom surface of one side portion of each of the plurality of through-holes. The flat heat pipe may further include a wire bundle inserted into a space from among each inner space of the plurality of through-holes in which the at least one groove is not formed.

Another exemplary embodiment of the present disclosure provides a flat heat pipe including: a flat body portion including a plurality of heat sink fins formed on an outer surface thereof, and a plurality of through-holes formed therein and being separated by at least one separation film; and a wire bundle inserted in one side portion of each of the plurality of through-holes.

Yet another exemplary embodiment of the present disclosure provides a method of fabricating a flat heat pipe, the method including: forming, through one extrusion process, a flat body portion including a plurality of heat sink fins on an outer surface thereof; forming at least one separation film in the body portion and forming a plurality of through-holes; and forming at least one groove in at least one surface from among a top surface and a bottom surface of one side portion of each of the plurality of through-holes. The method of fabricating a flat heat pipe may further include inserting a wire bundle into a space from among each inner space of the plurality of through-holes in which the at least one groove is not formed.

Still another exemplary embodiment of the present disclosure provides a method of fabricating a flat heat pipe, the method including: forming, through one extrusion process, a flat body portion including a plurality of heat sink fins on an outer surface thereof; forming at least one separation film in the body portion and forming a plurality of through-holes; and inserting a wire bundle into one side portion of each of the plurality of through-holes.

According to the exemplary embodiments of the present disclosure, a plurality of grooves is formed in a portion inside a through-hole within a flat body portion, and a liquid working fluid is made to flow by means of capillary force generated in the grooves, to improve heat dissipating performance of the flat heat plate.

Because a plurality of heat sink fins is integrally formed with the body portion on the outer surface of the body portion, thermal resistance is removed from between the interfaces of components, and heat dissipating performance may be further improved, thereby enabling fabrication with a single extrusion process.

The fabrication process may be further facilitated by forming the heat sink fins in a discontinuous form so that the heat sink fins are not disposed on an outer wall portion of the flat heat pipe, which is formed through the fabrication processes of a vacuum process and a sealing process.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, the above-described objects, characteristics, and advantages will be described in detail with reference to the accompanying drawings, and accordingly, a person having ordinary skill in the art to which the present disclosure pertains will be able to easily practice the technical spirit of the present disclosure. In the description of the present disclosure, the detailed description of well-known technology related to the present disclosure will be omitted whenever such description is deemed to unnecessarily obscure the main point of the present disclosure. A detailed description of exemplary embodiments according to the present disclosure will be made with reference to the accompanying drawings.

Figure 1:
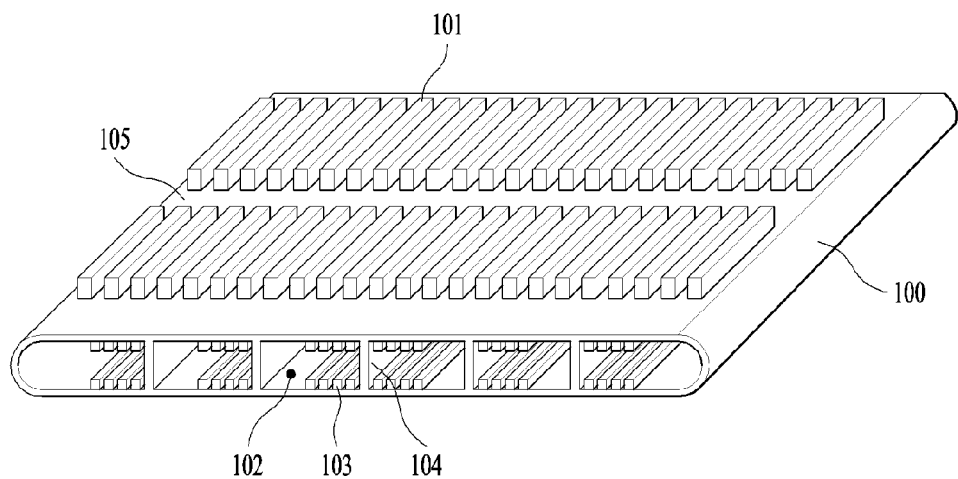
FIG. 1 is a structural diagram of a flat heat pipe according to a first exemplary embodiment of the present disclosure.

FIG. 1 is a structural diagram of a flat heat pipe according to a first exemplary embodiment of the present disclosure.

Referring to FIG. 1, the flat heat pipe according to the first exemplary embodiment of the present disclosure includes: a flat body portion 100 having a plurality of heat sink fins 101 formed on the outer surface thereof, and a plurality of through-holes 102 therein separated by at least one separation film 104; and at least one groove 103 formed on at least one surface from among a top surface and a bottom surface of a side portion of each of the plurality of through-holes 102.

The body portion 100 may be produced as a flat pipe-shaped metal plate through one extrusion process.

A plurality of through-holes 102, separated by at least one separation film 104 such that working fluid introduced from the outside may flow, is formed within the body portion 100.

A plurality of '⊔'-shaped grooves 103, extending in the same length direction as the through-holes 102, is formed on the inner side surfaces of the through-holes 102. However, the grooves 103 are only formed on one side portion of the through-holes 102 and are not formed on all the inner side surfaces of the through-holes 102, and are formed on at least one surface from among the top surface and the bottom surface of the side portion. Capillary force is generated by the corners of the '⊔' shaped grooves 103 such that liquid working fluid is drawn in.

A plurality of heat sink fins 101, for further improving the heat transfer performance to the surrounding area, is formed on the outer surface of the body portion 100, and the plurality of heat sink fins 101 may be formed in the same direction as the through-holes 102 and the grooves 103. The heat sink fins 101 are spaced apart from each other in a lengthwise direction of the body portion 100 and have a separated form 105, and there are no heat sink fins 101 formed at both ends.

In such a flat heat pipe according to the first exemplary embodiment of the present disclosure, even when a related art wick is not used to function as a passage for liquid working fluid to flow (return) from a condenser section toward an evaporator section, the liquid working fluid may flow by means of the capillary force generated by the corners of the '⊔'-shaped grooves 103. That is, the corner portions of the plurality of grooves 103 may perform the function of the related art wick.

The flat heat pipe according to the first exemplary embodiment of the present disclosure dissipates internal heat to the outside through a liquid-vapor phase change by means of the liquid working fluid entering, with the interior of the heat pipe maintained in a vacuum state.

Figure 2:
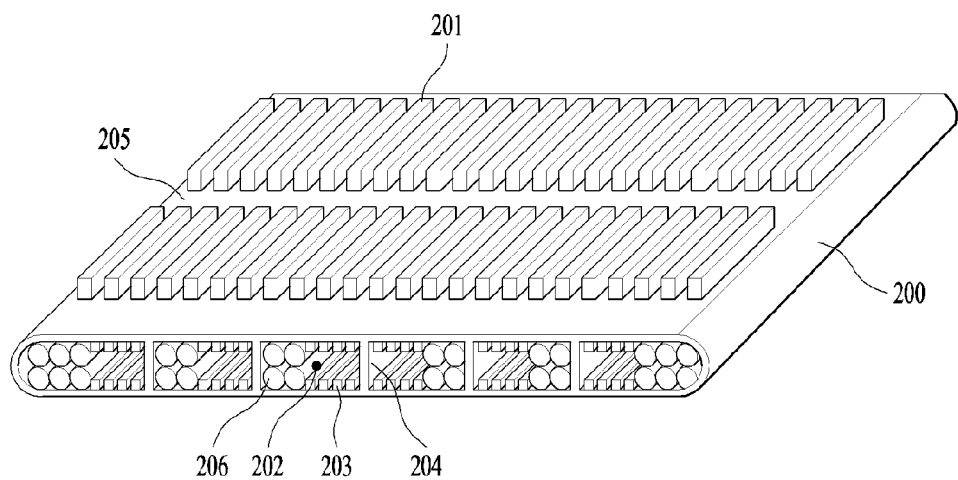
FIG. 2 is a structural diagram of a flat heat pipe according to a second exemplary embodiment of the present disclosure.

FIG. 2 is a structural diagram of a flat heat pipe according to a second exemplary embodiment of the present disclosure.

Referring to FIG. 2, the flat heat pipe according to the second exemplary embodiment of the present disclosure includes: a flat body portion 200 having a plurality of heat sink fins 201 formed on the outer surface thereof, and a plurality of through-holes 202 therein separated by at least one separation film 204; at least one groove 203 formed on at least one surface from among a top surface and a bottom surface of a side portion of each of the plurality of through-holes 202; and a wire bundle 206 inserted into a space, from among the inner spaces of each of the through-holes 202, in which at least one groove 203 is not formed.

In the second exemplary embodiment, the wire bundle 206 is inserted in a space in a through-hole 202 of the body portion 200 in which a groove 203 is not formed, and the wire bundle 206 performs the function of a passage through which condensed working liquid flows. Here, the capillary force for the flow of the working fluid is generated not only in the grooves 203, but also by the wire bundle 206.

The plurality of heat sink fins 201 is formed in the same direction as the through-holes 202 and the wire bundle 206, on the outer surface of the body portion 200, in order to further improve heat transfer characteristics to the surroundings area, and has a separated form 205, so that the heat sink fins 201 are not formed at both ends in the lengthwise direction of the body portion 200. The characteristics and effects of the remaining elements are the same as those described with reference to FIG. 1.

Figure 3:
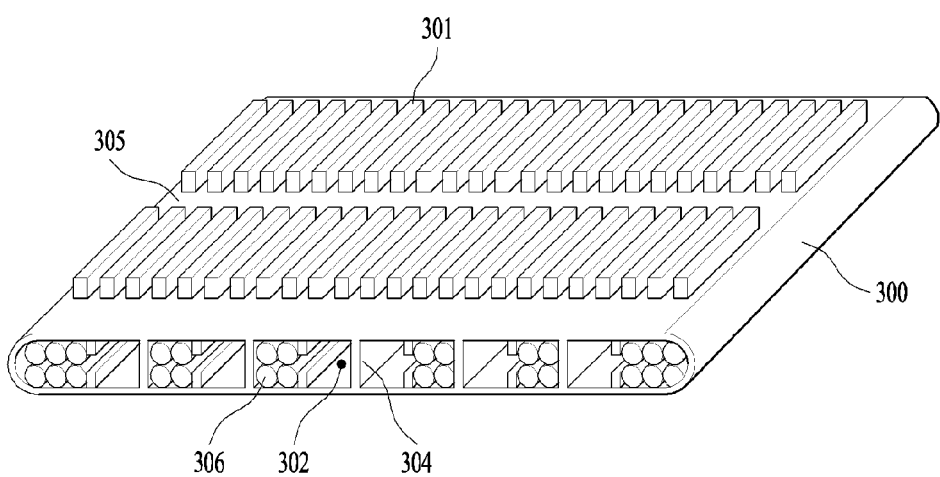
FIG. 3 is a structural diagram of a flat heat pipe according to a third exemplary embodiment of the present disclosure.

FIG. 3 is a structural diagram of a flat heat pipe according to a third exemplary embodiment of the present disclosure.

Referring to FIG. 3, the flat heat pipe according to the third exemplary embodiment of the present disclosure includes: a flat body portion 300 having a plurality of heat sink fins 301 formed on the outer surface thereof, and a plurality of through-holes 302 therein separated by at least one separation film 304; and a wire bundle 306 inserted into one side portion of each of the plurality of through-holes 302.

In the third exemplary embodiment, the grooves 103 and 203 in FIGS. 1 and 2 are not formed, and capillary force for the flow of working fluid in the through-holes 302 is generated by only the wire bundle 306. While in terms of performance, this may be disadvantageous as compared to the second exemplary embodiment, in the case of a flat heat pipe having a relatively small thickness, because it is important to secure a maximum space for the flow of vapor which takes up a large specific volume in order to improve overall working performance, in this respect, the third exemplary embodiment may have superior working performance over the second exemplary embodiment.

While the technical spirit of the present disclosure has been described in detail according to exemplary embodiments above, it will be noted that the embodiments above are only for the sake of providing a description and are not intended to be limiting. Those of ordinary skill in the art of the present disclosure will realize that various embodiments are possible within the scope of the technical spirit of the present disclosure.

For example, instead of a '⊔'shape, the grooves 103 and 203 applied to the first and second exemplary embodiments of the present disclosure may have a 'v' shape or a polygonal shape with at least one corner. The wire bundles 206 and 306 applied to the second and third exemplary embodiments of the present disclosure may be replaced by various forms such as a knitted net, a sintered body structure, a fiber net, and a screen net.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A flat heat pipe comprising:
   a flat body portion including a plurality of heat sink fins formed on an outer surface thereof, and a plurality of through-holes formed therein and being separated by at least one separation film;
   at least one groove formed in at least one surface among a top surface and a bottom surface of each of the plurality of through-holes,
   wherein each of the plurality of through-holes includes a first region in which the at least one groove is formed and a second region in which no grooves are formed in either the top or bottom surface; and
   a wire bundle inserted into the second region of each of the plurality of through-holes.

2. The flat heat pipe of claim 1, wherein the plurality of heat sink fins are formed separated from each other in a lengthwise direction of the body portion.

3. The flat heat pipe of claim 1, wherein the plurality of heat sink fins, the plurality of through-holes, and the at least one groove are all formed in the same direction.

4. The flat heat pipe of claim 1, wherein the at least one groove is formed in a polygonal shape with a corner.

5. The flat heat pipe of claim 1,
   wherein the plurality of through-holes includes two peripheral through-holes disposed outermost in a lengthwise direction of the flat body portion and inner through-holes disposed between the two peripheral through-holes, each of the inner through-holes being defined by the top surface, the bottom surface and two adjacent separation films.

6. A method of fabricating a flat heat pipe, the method comprising:
   forming, through one extrusion process, a flat body portion including a plurality of heat sink fins on an outer surface thereof;
   forming at least one separation film in the body portion and forming a plurality of through-holes; and
   forming at least one groove in at least one surface among a top surface and a bottom surface of each of the plurality of through-holes, wherein each of the plurality of through-holes includes a first region in which the at least one groove is formed and a second region in which no grooves are formed in either the top or bottom surface; and
   inserting a wire bundle into the second region of each of the plurality of through-holes.

7. The method of fabricating a flat heat pipe of claim 6, wherein the plurality of heat sink fins are formed separated from each other in a lengthwise direction of the body portion.

8. The method of fabricating a flat heat pipe of claim 6, wherein the plurality of heat sink fins, the plurality of through-holes, and the at least one groove are all formed in the same direction.

9. The method of fabricating a flat heat pipe of claim 6,
   wherein the plurality of through-holes includes two peripheral through-holes disposed outermost in a lengthwise direction of the flat body portion and inner through-holes disposed between the two peripheral through-holes, each of the inner through-holes being defined by the top surface, the bottom surface and two adjacent separation films.

* * * * *